United States Patent
Akiyama (10) Patent No.: US 6,452,259 B2
(45) Date of Patent: Sep. 17, 2002

(54) STACKED SUBSTRATE AND SEMICONDUCTOR DEVICE

(75) Inventor: Mitsukuni Akiyama, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/203,699

(22) Filed: Dec. 2, 1998

(30) Foreign Application Priority Data

Dec. 3, 1997 (JP) .............................................. 9-333376

(51) Int. Cl.7 .............................................. H01L 23/02
(52) U.S. Cl. ..................................... 257/686; 257/777
(58) Field of Search ................................. 257/686, 777, 257/778, 723; 438/108

(56) References Cited

U.S. PATENT DOCUMENTS

| | | | | |
|---|---|---|---|---|
| 4,703,483 A | * | 10/1987 | Enomoto et al. | 371/24 |
| 5,781,031 A | * | 7/1998 | Bertin et al. | 257/777 |
| 5,783,870 A | * | 7/1998 | Mostafazadeh et al. | 257/777 |
| 5,790,384 A | * | 8/1998 | Ahmad et al. | 257/777 |
| 5,818,107 A | * | 10/1998 | Pierson et al. | 257/723 |
| 5,838,603 A | | 11/1998 | Toshiki et al. | 365/63 |
| 5,897,228 A | * | 4/1999 | Schrock | 396/297 |
| 5,923,090 A | * | 7/1999 | Fallon et al. | 257/777 |
| 6,057,598 A | * | 5/2000 | Payne et al. | 257/723 |
| 6,064,585 A | | 5/2000 | Toshiki et al. | 365/63 |
| 6,313,493 B1 | | 11/2001 | Toshiki et al. | 257/275 |

FOREIGN PATENT DOCUMENTS

| | | |
|---|---|---|
| JP | 8-167703 | 11/1995 |
| JP | 9-503622 | 3/1996 |
| WO | WO 95/09438 | 4/1995 |

* cited by examiner

*Primary Examiner*—Phat X. Cao
(74) *Attorney, Agent, or Firm*—Merchant & Gould P.C.

(57) ABSTRACT

A semiconductor device of a high degree of integration capable of bringing about required functions within a short period of delivery time. A stacked chip 4 is constituted by bonding together pads 8a, 8b, . . . of a first chip 8 and pads 6a, 6b, . . . of a second chip 6. The first chip 8 is formed with an FPGA (field programmable gate array) and the second chip 6 is formed with a CPU (central processing unit). An LSI 2 is used for example as a controller for controlling external devices. In that case, the FPGA is used as an interface circuit interconnecting the CPU and the external devices. A required interface circuit corresponding to the external devices is obtained by changing the program of the FPGA. This type of controller required to save space to a great extent may be made compact by the use of the stacked chip 4.

10 Claims, 12 Drawing Sheets

STACKED SUBSTRATE AND SEMICONDUCTOR DEVICE

CROSS-REFERENCE TO RELATED APPLICATION

The entire disclosure of the Japanese patent application No Hei 9-333376 filed on Dec. 3, 1997 including the specification, claims, drawings, and summary are incorporated herein by reference in its entirety.

BACKGROUND OF THE INVENTION

1. Field of the Invention

This invention relates to substrates and semiconductor devices, in particular to a stacked substrate body stacked with substrates, and a semiconductor device having the stacked substrate body.

2. Description of the Prior Art

PLDs (programmable logic devices) are known as LSIs to which a user can write logic functions from a position near at hand.

The PLDs include many kinds from small PLAs (programmable logic arrays) basically constituted with an AND-plane and an OR-plane to large scale FPGAs (field programmable gate arrays).

They are all constituted with many logic circuits arranged on chips in advance so that they can be interconnected through programmable switches. Therefore, a user may bring desired functions by connecting and disconnecting those switches according to specified patterns. In other words, the use of the PLDs makes it possible to bring LSIs having desired functions within a short delivery time.

Therefore, the PLDs are used as interface circuits in microcomputer systems for controlling machines and devices. While microcomputer systems require dedicated interface circuits corresponding to machines and devices to be controlled, use of PLDs makes it possible to bring about required interface circuits corresponding to various machines and devices within a short period of delivery time.

However, the conventional PLDs as described above have the following problems: Since the conventional PLD is constituted as a stand-alone package, when it is used in the above-mentioned microcomputer system, a single interface circuit alone requires a package. As a result, the degree of integration cannot be improved.

SUMMARY OF THE INVENTION

The object of this invention is to provide a highly integrated semiconductor device capable of solving the above problem and bringing about required functions within a short period of delivery time.

The stacked substrate body and the semiconductor device of this invention are characterized by comprising;

a first substrate having: a first functional section having the function of acquiring required functions by connecting to and disconnecting from each other a plurality of pre-arranged circuit elements through programmable switching means, and a first input-output terminal corresponding to the first functional section, and a second substrate having: a second functional section having the functions associated with the first functional section; and a second input-output terminal corresponding to the second functional section, the first substrate and the second substrate being stacked together so that the first input-output terminal and the second input-output terminal are electrically connected to each other.

The stacked substrate body and the semiconductor device of this invention is characterized by comprising;

a first substrate having: a first functional-section having the function of storing information; and a first input-output terminal corresponding to the first functional section, and a second substrate having: a second functional section having the function of controlling the first functional section; and a second input-output terminal corresponding to the second functional section, the first substrate and the second substrate being stacked together so that the first input-output terminal and the second input-output terminal are electrically connected to each other.

By the way, the term "circuit element" as used in the claims refers to a circuit constituting element, and the concept includes any element and circuit such as logic elements, delay elements, memory elements, operation circuits, wiring, etc. In embodiments, data input lines L11, . . . and AND-input lines L21, . . . in FIG. 3 correspond to this concept.

The term "input-output terminal" refers to any terminal for input and/or output, and the concept includes for example dedicated input terminals for receiving the supply of signals and power, dedicated output terminals for supplying out, and dual-purpose input-output terminals. In embodiments, pads 8a, 8b, . . . and pads 6a, 6b, . . . correspond to this term.

While the characteristics of this invention may be widely shown as the above, its constitution and contents together with the object and characteristics will be made clearer by the following disclosure in reference to the appended drawings.

DESCRIPTION OF PREFERRED EMBODIMENTS

Figure 1:
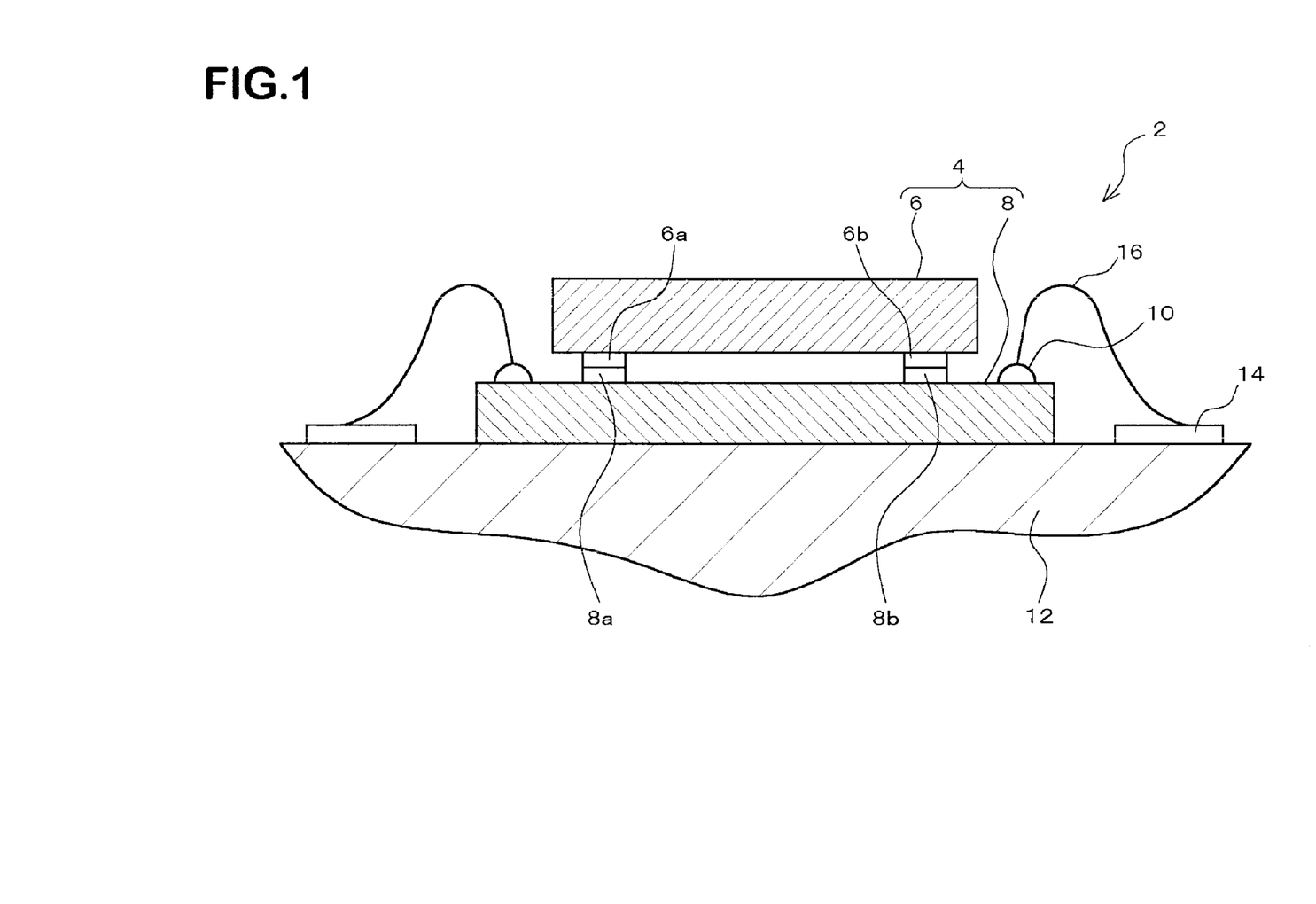
FIG. 1 shows a cross-sectional constitution of an LSI (large scale integrated circuit) 2 or a semiconductor device as an embodiment of this invention.

FIG. 1 shows a cross-sectional constitution of an LSI (large scale integrated circuit) 2 or a semiconductor device as an embodiment of this invention. The LSI 2 is constituted with a stacked chip 4 as a stacked substrate body placed and secured onto a package 12. The stacked chip 4 is a single body made by laminating together a first substrate or a first chip 8 and a second substrate or a second chip 6.

Figure 2:
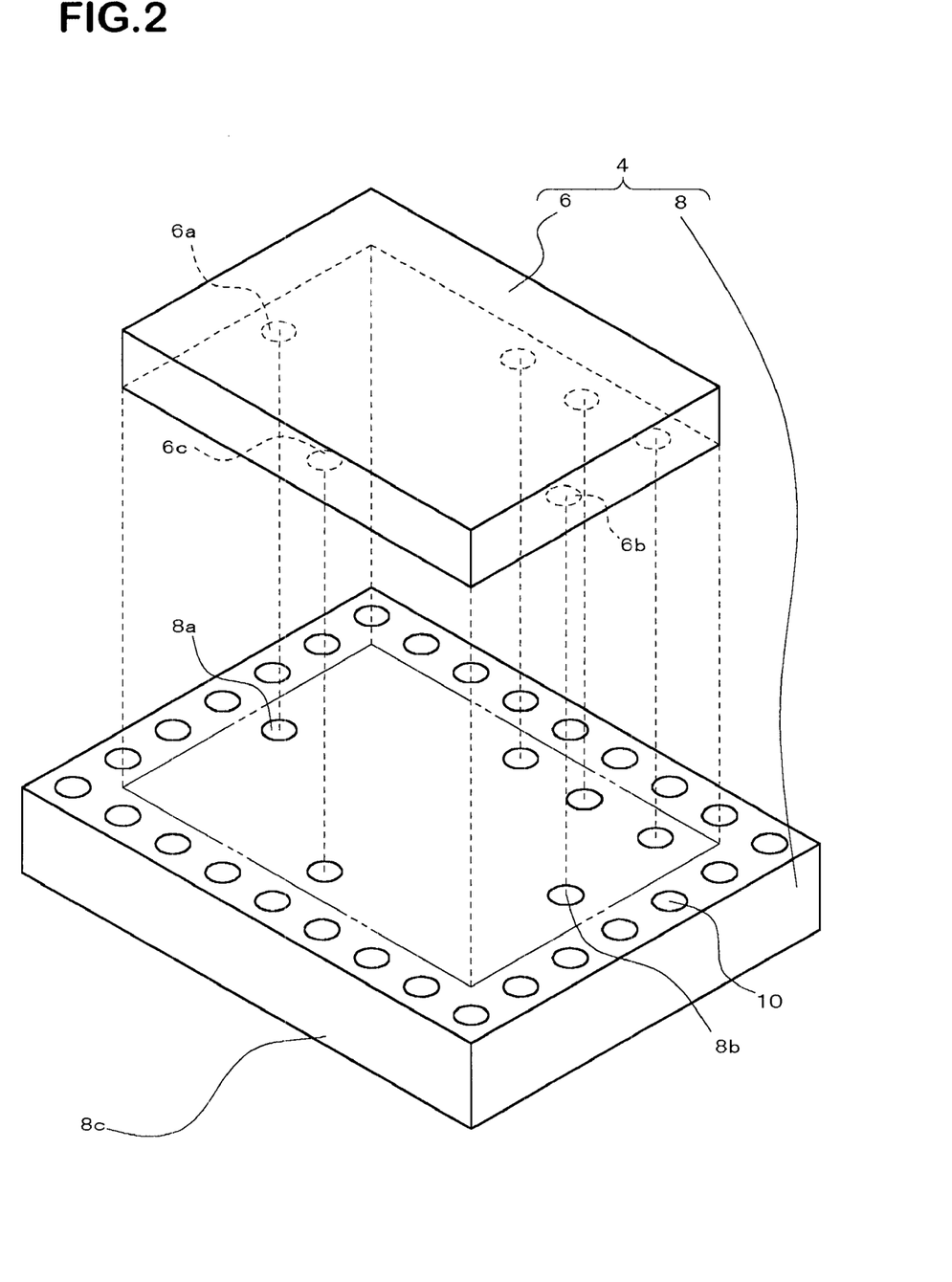
FIG. 2 is an exploded perspective view of a stacked chip 4.

FIG. 2 is an exploded perspective view of the stacked chip 4. The first chip 8 and the second chip 6 both are IC chips constituted with semiconductors. In this embodiment, the first chip 8 is formed to have an FPGA (field programmable gate array) as a programmable first functional section, and the second chip 6 is formed to have a CPU (central processing unit) as a second functional section.

The first chip 8 is provided on its top surface with a plurality of pads 8a, 8b, . . . as first input-output terminals. In this embodiment, the pads 8a, 8b, . . . are for performing input and output operations relative to the FPGA. In the vicinity of the outer circumference of the top surface of the first chip 8 are provided a plurality of pads 10 (terminals for the outside) for performing input and output with the outside.

The second chip 6 is provided on its underside with a plurality of pads 6a, 6b, . . . as second input-output terminals. In this embodiment, the plurality of pads 6a, 6b, . . . are for performing input and output operations relative to the CPU.

Each of the pads 8a, 8b, . . . and each of the pads 6a, 6b, are disposed at positions opposite to each other. The pads 8a, 8b, . . . are made of gold (Au) for example, while the pads 6a, 6b . . . are made of tin (Su) and they are bonded together with a technique of making bumps utilizing eutectic crystals.

The stacked chip 4 formed as described above is placed and secured onto the package 12 as shown in FIG. 1. A pad 14 on the package 12 and a pad 10 on the first chip 8 are interconnected through a bonding wire 16. By the way, the stacked chip 4 and the bonding wire 16 are sealed with a sealing material (not shown) of epoxy resin or the like.

In this embodiment, the LSI 2 is used as a controller for controlling external devices. That is to say, the external devices are controlled by the use of a CPU (not shown) provided on the second chip 6. The program for controlling the external devices is disposed outside the LSI 2 in the form of an ROM (read-only memory, not shown and sent to the CPU through the pad 14 provided on the package 12. The external devices are electrically connected to the pad 14 provided on the package 12. An FPGA formed on the first chip 8 functions as an interface circuit interconnecting the CPU and the external devices.

Therefore, a required interface circuit corresponding to the external devices may be obtained by changing the program of the FPGA. Thus the required interface circuit may be obtained without forming an IC having a new dedicated interface circuit. In other words, there is no need for developing a new dedicated IC or preparing other manufacturing process for the dedicated IC.

A power source (not shown) is provided outside the LSI 2 to supply power from the power source through the pad 14 to the first chip 8, and the power is further supplied through the first chip 8 to the second chip 6.

Therefore, it is possible to supply both high and low voltage power to the first chip 8 which requires a high voltage to write and erase programs to and from the FPGA, and to supply a low voltage power only to the second chip 6 carrying a CPU which does not require a high voltage. Thus only the first chip 8 needs to be made with a specification to stand a high voltage. In other words, the second chip 6 may be made to stand a low voltage only and accordingly, the degree of integration of the second chip 6 carrying the CPU may be improved. Another advantage of this type of controller is that by use of the stacked chip 4, it may be made compact and space can be saved to a large extent.

Figure 3:
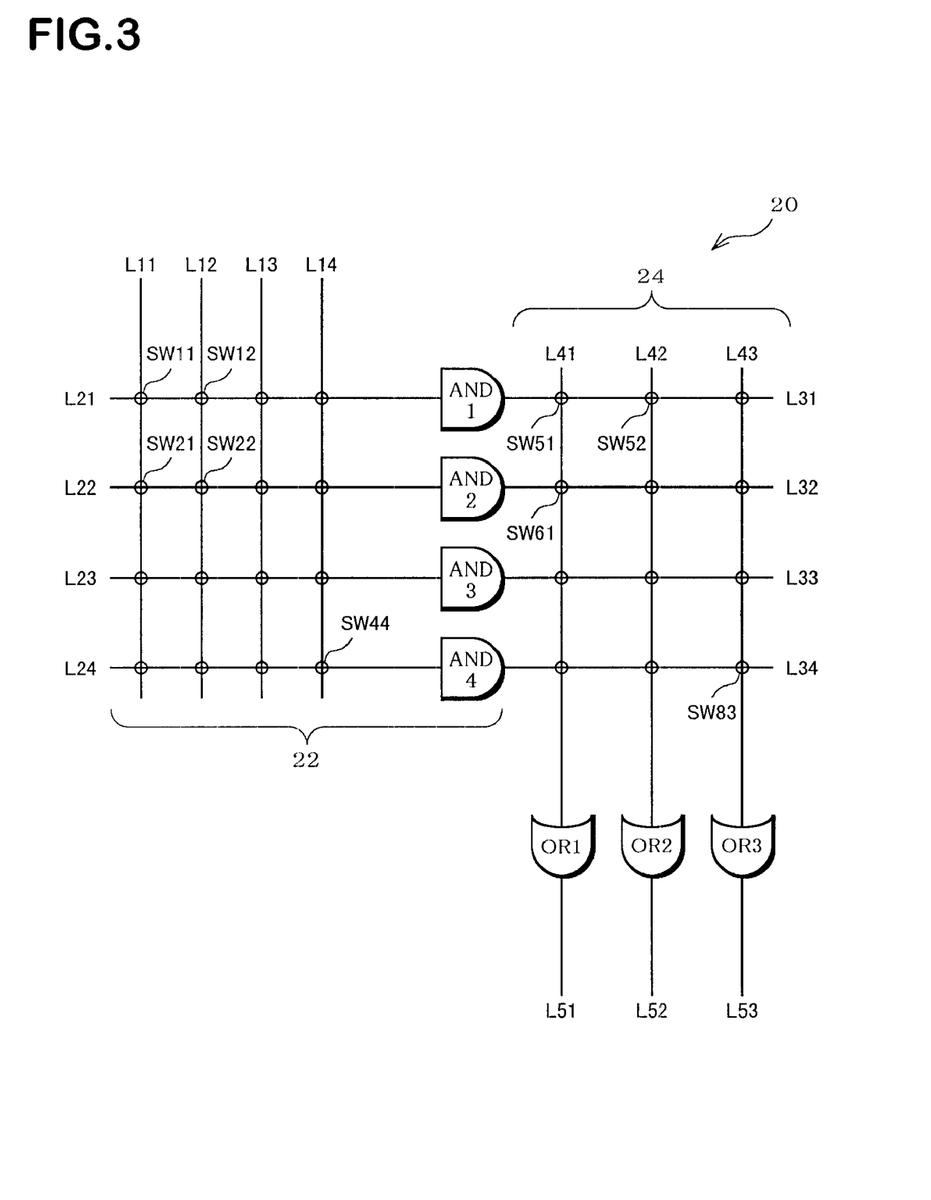
FIG. 3 is a schematic drawing of an example circuit constitution of a logic array 20 constituting an FPGA formed on a first chip 8.

FIG. 3 is a schematic drawing of an example circuit constitution of a logic array 20 constituting the FPGA formed on the first chip 8. The FPGA is a PLD of a relatively complicated constitution, and its logic array 20 has an AND-plane portion and an OR-plane portion. By the way, the FIG. 3 is a partial drawing for explanation of the circuit constitution of the logic array 20. The actual logic array 20 is more complicated in the constitution.

In the example of FIG. 3, the AND-plane portion 22 has, as circuit elements; four data input lines L11, L12, L13 and L14; four AND-input lines L21, L22, L23 and L24; and four AND-gates AND1, AND2, AND3, and AND4.

Programmable switching means or switches SW11 through SW44 are disposed at sixteen intersections on the AND-plane portion 22 where the data input lines L11 through L14 cross the AND-input lines L21 through L24.

The OR-plane portion 24 has as circuit elements; four AND-output lines L31, L32, L33, and L34; three OR-input lines L41, L42, and T43; three OR-gates OR1, OR2 and OR3; and three OR-output lines L51, L52 and L53.

Like the AND-plane portion, programmable switching means or switches SW51 through SW83 are disposed at twelve intersections on the OR-plane portion 24 where the AND-output lines L31 through L34 cross the OR-input lines L41 through L43.

By the way, while the FIG. 3 shows the use of the four AND-gates AND1, AND2, AND3, and AND4, and the three OR-gates OR1, OR2 and OR3 for the convenience of explanation, in the actual circuit, seven NAND-gates are used instead to make a circuit which is logically equivalent to that shown in the FIG. 3.

Figure 4A:
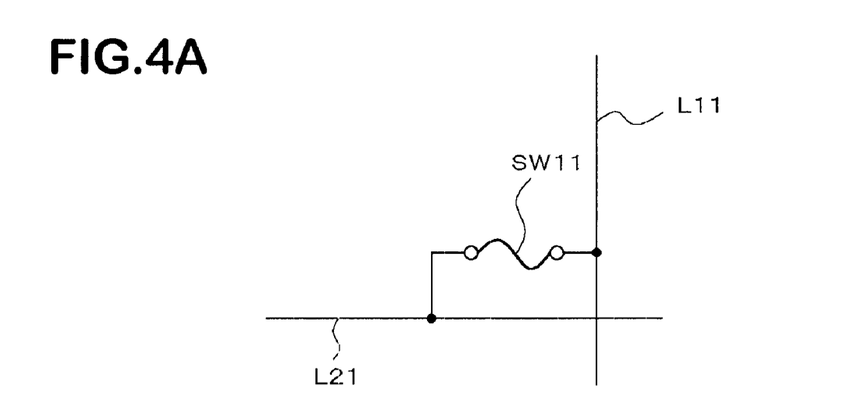
FIGS. 4A, 4B, and 4C show specific examples of programmable switching means.
Figure 4B:
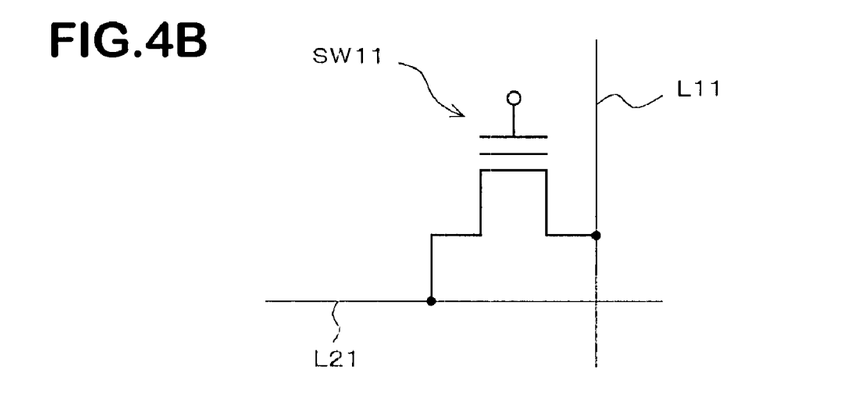
Figure 4C:
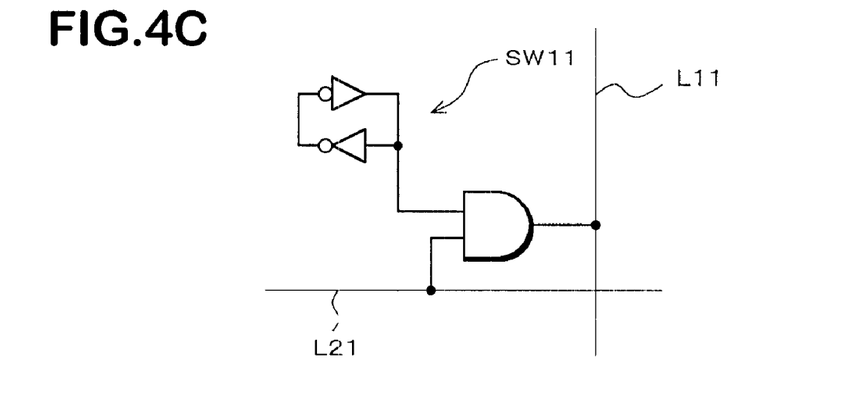

Specific examples of the programmable switching means (such as the switch SW11) are shown in FIGS. 4A, 4B and 4C. A fuse shown in FIG. 4A may be used as the switch SW11. In that case, to disconnect the data input line L11 from the AND-input line L21, the fuse may be burned out.

In contrast to the use of the fuse, an anti-fuse (not shown) as the SW11 may also be used that is constituted that insulation prepared in advance is broken to make the data input line L11 and the AND input line L21 conductive to each other.

Also, a flash memory or an EEPROM (electrically erasable and programmable read-only memory) shown in FIG. 4B may be used as the switch SW11. The use of the EEPROM makes it possible to rewrite logic functions.

Also, an SRAM (static random-access memory) shown in FIG. 4C may be used as the SW11 to rewrite the logic functions in real time.

Furthermore, a memory using a ferroelectric material may be used as the switch SW11. The use of the ferroelectric memory makes it possible to bring about a switch SW11 that is nonvolatile and enables high speed rewriting.

Figure 5:
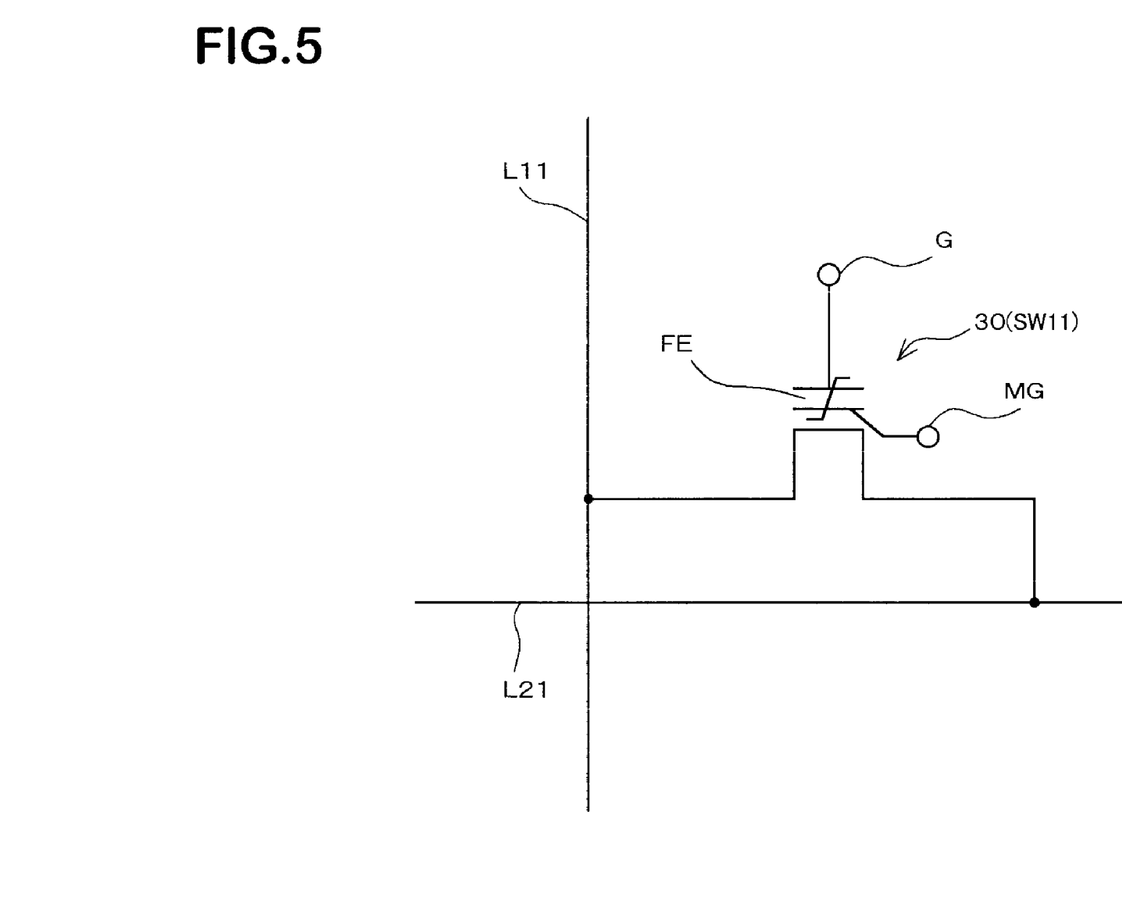
FIG. 5 shows an example circuit constitution of a switch SW11 using a memory using a ferroelectric material.

FIG. 5 shows an example of circuit constitution of the switch SW11 using a ferroelectric memory. In this example, the switch SW11 has a ferroelectric transistor 30.

While a ferroelectric layer FE is polarized when a specified voltage is applied between the gate terminal G and the data input line L11, the direction of polarization of the ferroelectric layer FE varies according to the direction of the voltage applied. The difference in the polarized direction of the ferroelectric layer FE produces the difference in the drain current value for the same gate voltage. Using this property, a constitution is made to produce closed and open states of the switch SW11.

Although the relationship of the direction of polarization of the ferroelectric layer FE and the direction of the voltage applied between the gate terminal G and the data input line L11 is affected with other factors and is not always the same, at least under the same condition the relation thereof may be the same constant.

Therefore, for example, if polarization occurs in the direction in which a drain current above the threshold flows for a specified gate voltage when a voltage being positive at the gate terminal G relative to the data input line L11 is applied, and if polarization occurs in the direction in which only a current below the threshold flows for the specified voltage when an opposite voltage is applied, the former is the closed state of the switch SW11 while the latter is the open state of the switch SW11.

In this way, the connection/disconnection data of the switch SW11 can be rewritten by changing the direction of the voltage applied between the gate terminal G and the data input line L11.

While the example shown in FIG. 5 is constituted that the polarized direction of the ferroelectric layer FE is changed by changing the direction of the voltage applied between the gate terminal G and the data input line Ll1, it may also be constituted that an electrode terminal is connected to the end opposite of the gate terminal G of the ferroelectric layer FE to use it as a memory gate terminal MG and to change the polarized direction of the ferroelectric layer FE by changing the voltage direction applied between the gate terminal G and the memory gate terminal MG.

Alternatively, a memory having a ferroelectric capacitor (not shown) may also be used as the ferroelectric memory using for the switch SW11 in place of the memory having a ferroelectric transistor shown in FIG. 5.

While the above embodiment is explained as an example in which the LSI 2 is used as a controller for controlling external devices, this invention is not limited to the above but may also be applied to the case in which the LSI 2 is used, for example, as a general use FPGA.

In that case, like the previous embodiment, an FPGA is formed as the first functional section on the first chip 8. On the other hand, a writing circuit is formed as the second functional section on the second chip 6 for writing and erasing programs on the FPGA. In this way, the FPGA can be produced without requiring an external writing device.

This invention may also be applied to the case in which the LSI 2 is used as a DSP (digital signal processor). To use the LSI 2 as the DSP, a RAM (random access memory) as the second functional section is formed on the second chip 6.

On the other hand, while an FPGA is formed as the first functional section on the first chip 8 like in the previous embodiment, FPGA is programmed to function as a signal processing section.

With the above setting, the FPGA may apply a specified process to signals given from the RAM formed on the second chip 6 and output them outside the LSI 2, or apply a specified process to signals given from outside the LSI 2 and stored them in the RAM formed on the second chip 6.

The contents of the signal processing may be easily changed by changing the program of the FPGA. Also, a compact DSP may be produced by the use of the stacked chip 4.

It may also be constituted for example that an FPGA is formed on the first chip 8 while forming a flash memory on the second chip 6. In that case, there are cases in which the FPGA of the first chip 8 and the flash memory of the second chip 6 both require high voltage lines for writing and erasing. In such cases, it is convenient if the voltage required for writing and erasing the FPGA is the same as that required for writing and erasing the flash memory.

With such a voltage setting, high voltage lines of both of the first chip 8 and the second chip 6 may be shared between both of the chips through either the pads 8a, 8b, . . . or pads 6a, 6b, . . . As a result, spaces required for the high voltage wiring may be saved.

Furthermore in this case, if plural sets of pads are prepared for connecting the high voltage lines, it is preferable to reduce connection resistance. To reduce the connection resistance by parallel forming of the connection points is specially desirable because the connection resistance tends to increase when the pads 8a, 8b, . . . and 6a, 6b, . . . are connected by the above-mentioned bump technique or the anisotropic conductor to be described later.

Also, the LSI 2 may be used as a frequency synthesizer using a PLL (phase lock loop) circuit. In that case, an analog circuit VCO (voltage control oscillation circuit) as the second functional section is formed on the second chip 6.

On the other hand, an FPGA as the first functional section is formed on the first chip 8 like in the previous embodiment. In that case, the FPGA is programmed to function as a circuit for diving the frequency of the output of the VCO and then feeding it back to the VCO.

With such a setting, the LSI 2 may be used as a frequency synthesizer using a PLL circuit. In that case, the frequency to be outputted may be easily changed by changing the program of the FPGA. Another advantage is that a compact synthesizer is obtained by the use of the stacked chip 4.

By the way, when the analog circuit as the second functional section is mounted on the second chip 6 as described above, it is recommended that the pads required to receive and give out analog signals be arranged without an intervening buffer.

Also in this case, by making conductive any of the pad 10 and for example the pad 8a disposed on the first chip 8 (through-pads), the pad 10 may be electrically connected to the pad 6a of the second chip 6 through the pad 8a. Such an arrangement is convenient: when a terminal for the outside is not disposed directly on the second chip 6, a pad 10 disposed on the first chip 8 for example is used as an input terminal for analog signals, or a pad 10 is used as a power source terminal solely for the analog circuit.

While each of the above embodiments is described with the FPGA as the first functional section formed on the first chip 8, this invention is not limited to the above. For example, the first chip 8 may be formed with a memory device as the first functional section. In that case, it is recommended to form a writing circuit as the second functional section on the second chip 6 for writing and erasing data on the memory device.

With such a constitution, an information storage device is obtained without requiring an external writing device. Alternatively, an information storage device of a small projection area with functions of both storing and writing information may be produced by stacking the first chip 8 and the second chip 6.

In each of the above embodiments, while the case of using the bump technique is described as an example method of electrically interconnecting the pads 8a, 8b, . . . and 6a, 6b, . . . , this invention is not limited to the above: For example, the pads 8a, 8b, . . . and 6a, 6b, . . . may be interconnected by the use of soldering technique.

Figure 6:
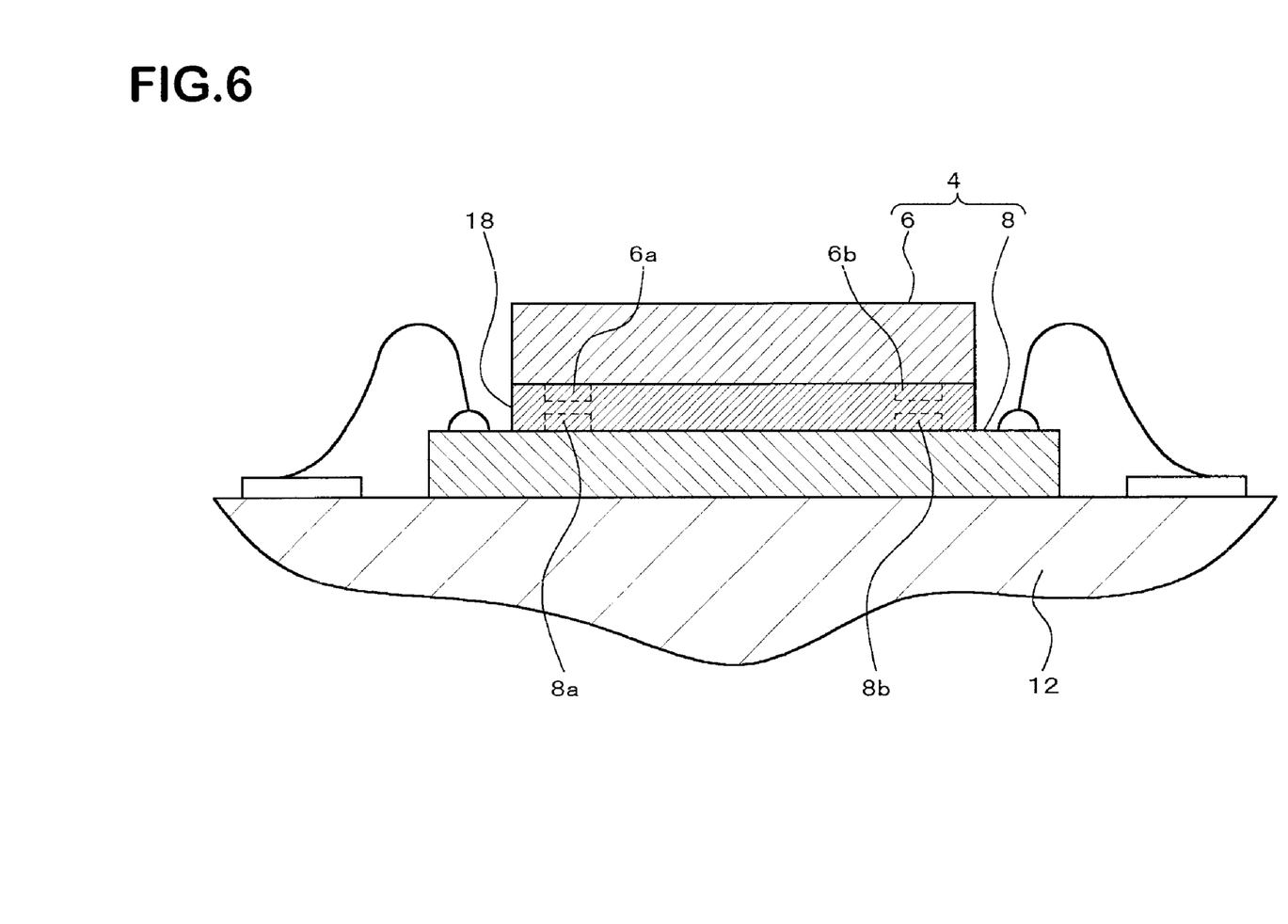
FIG. 6 shows a cross-sectional constitution of a stacked chip as another embodiment of the invention.

Furthermore as shown in FIG. 6, the pads 8a, 8b, . . . and 6a, 6b, . . . may be interconnected by the use of an anisotropic conductor 18. The anisotropic conductor 18 is conductive in one direction only and has adhesive property. Any thermosetting adhesive for example may be used as the anisotropic conductor.

By the use of such an anisotropic conductor 18, the first chip 8 and the second chip 6 may be securely bonded together. Securely bonding together the first chip 8 and the second chip 6 using the anisotropic conductor 18, the pads 8a, 8b, . . . and pads 6a, 6b, . . . disposed in opposing positions may be electrically interconnected.

In each of the described embodiments, the stacked chip 4 is secured to the package 12 and the pad 10 on the stacked chip 4 and the pad 14 disposed on the package are interconnected through a bonding wire 16 as shown in FIG. 1, but this invention is not limited to such configuration.

Figure 7:
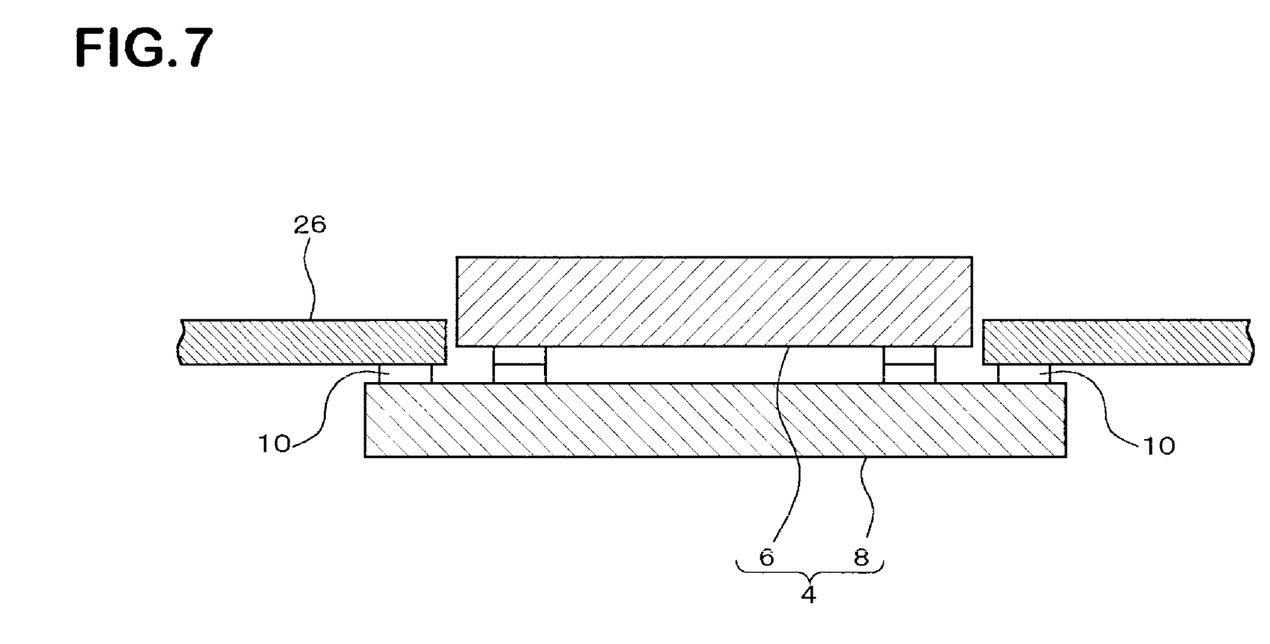
FIG. 7 shows a cross-sectional constitution of a stacked chip as still another embodiment of the invention.

For example as shown in FIG. 7, the stacked chip 4 may be mounted directly on a plastic substrate in the form of a film. Thus, the substrate on which the stacked chip 4 is mounted is generally referred to as TAB (tape-automated bonding) 26. The TAB 26 has printed wiring (not shown) with its pad portion (not shown) connected to the pad 10 of the stacked chip 4. As each embodiments described above, the stacked chip 4 is sealed with a sealing member (not shown) made of epoxy resin or the like.

Figure 8:
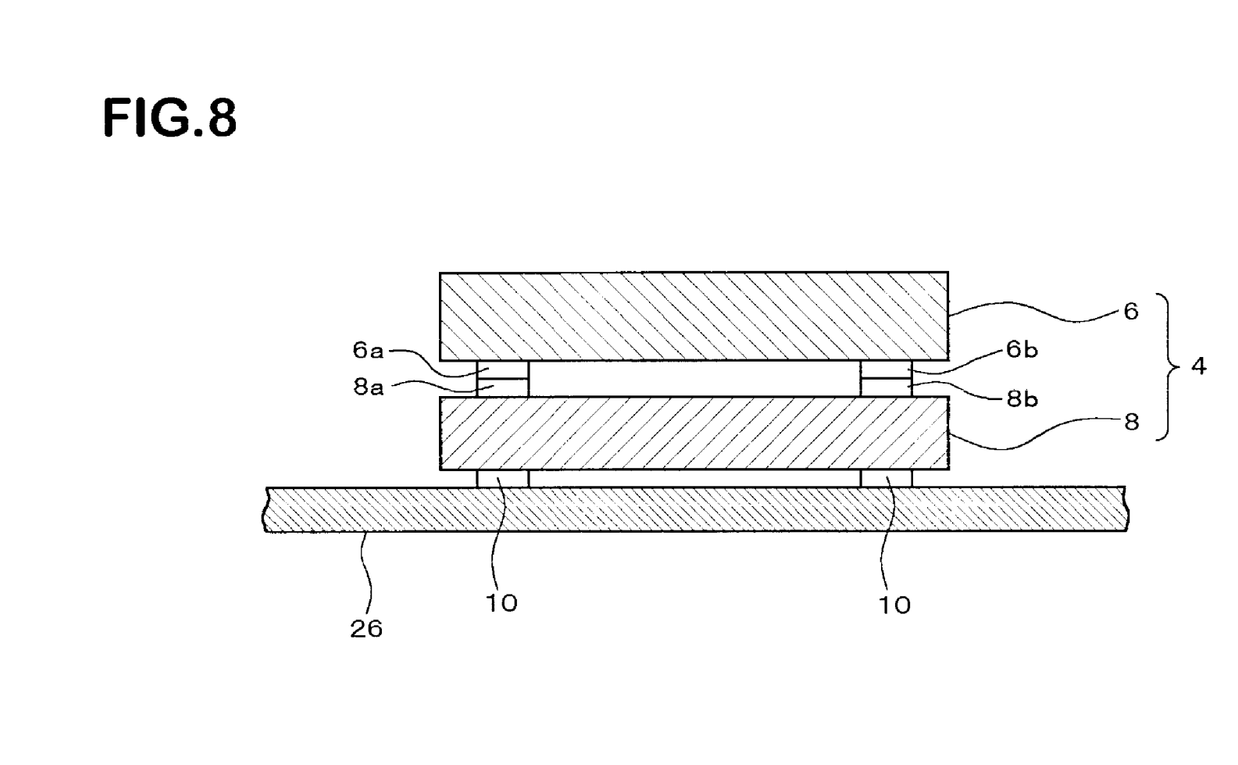
FIG. 8 shows a cross-sectional constitution of a stacked chip as still another embodiment of the invention.

As shown in FIG. 8, when it is possible to dispose pads 10 on the underside of the first chip 8 (namely the opposite surface from where the pads 8a, 8b, . . . are disposed), the stacked chip 4 may be mounted up to the top surface of the TAB 26.

In each of the described embodiments, power is supplied to the first chip 8 and further through the first chip 8 to the second chip 6, however, this invention is not limited to such configuration. For example, the constitution that the power is supplied to the second chip 6 and the second chip 6 in turn supplies power to the first chip 8 in possible. Also, the positioning of the first and second chips 8 and 6 may be reversed.

In each of the described embodiments, while the stacked chip 4 is described as an example with two chips stacked, this invention may also be applied to stacked chips comprising three or more chips.

Figure 9:
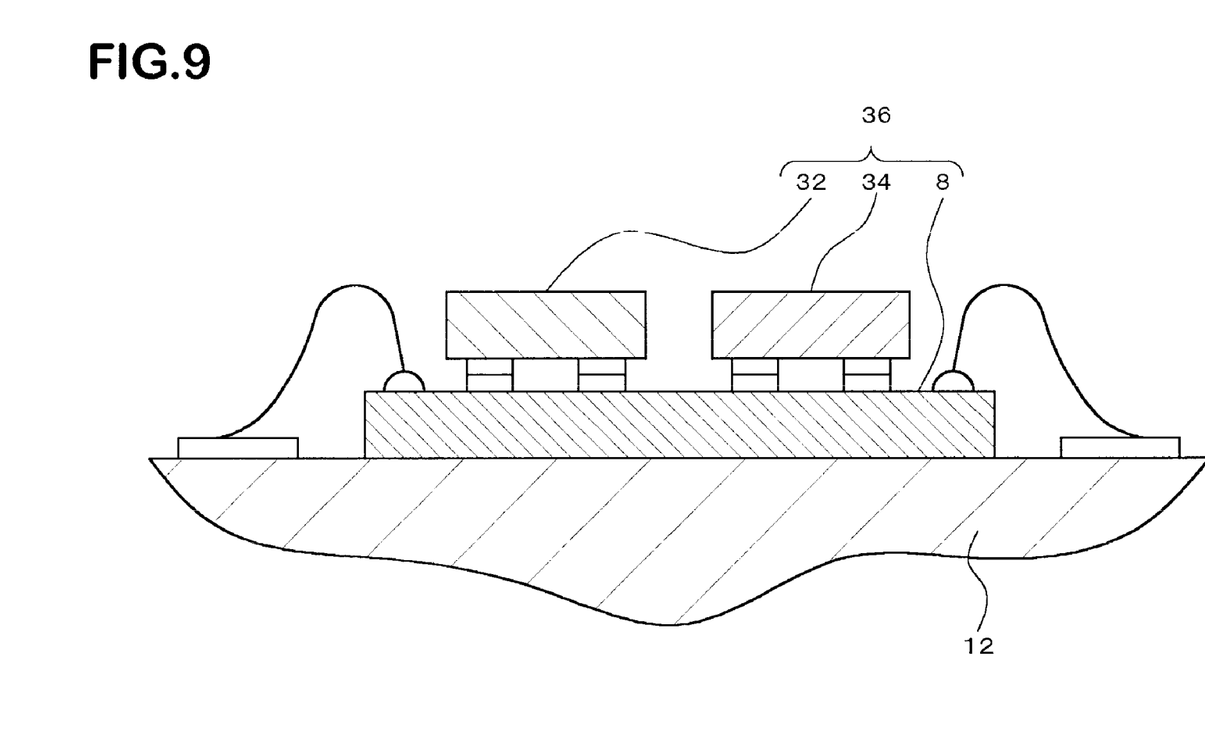
FIG. 9 shows a cross-sectional constitution of a stacked chip as still another embodiment of the invention.

FIG. 9 shows a stacked chip 36 comprising the first chip 8 over which are placed a second chip 32 and a third chip 34 side by side. The stacked chip 36 is placed on and secured to the package 12.

A controller for controlling external devices using a single stacked chip 36 may be produced for example by pre-programming an FPGA formed on the first chip 8 to function as an interface circuit and forming a CPU on the second chip 32, as well as forming a ROM on the third chip 34. In this case, the first chip 8 corresponds to the first substrate while the second chip 32 and the third chip 34 correspond to the second substrate.

Figure 11:
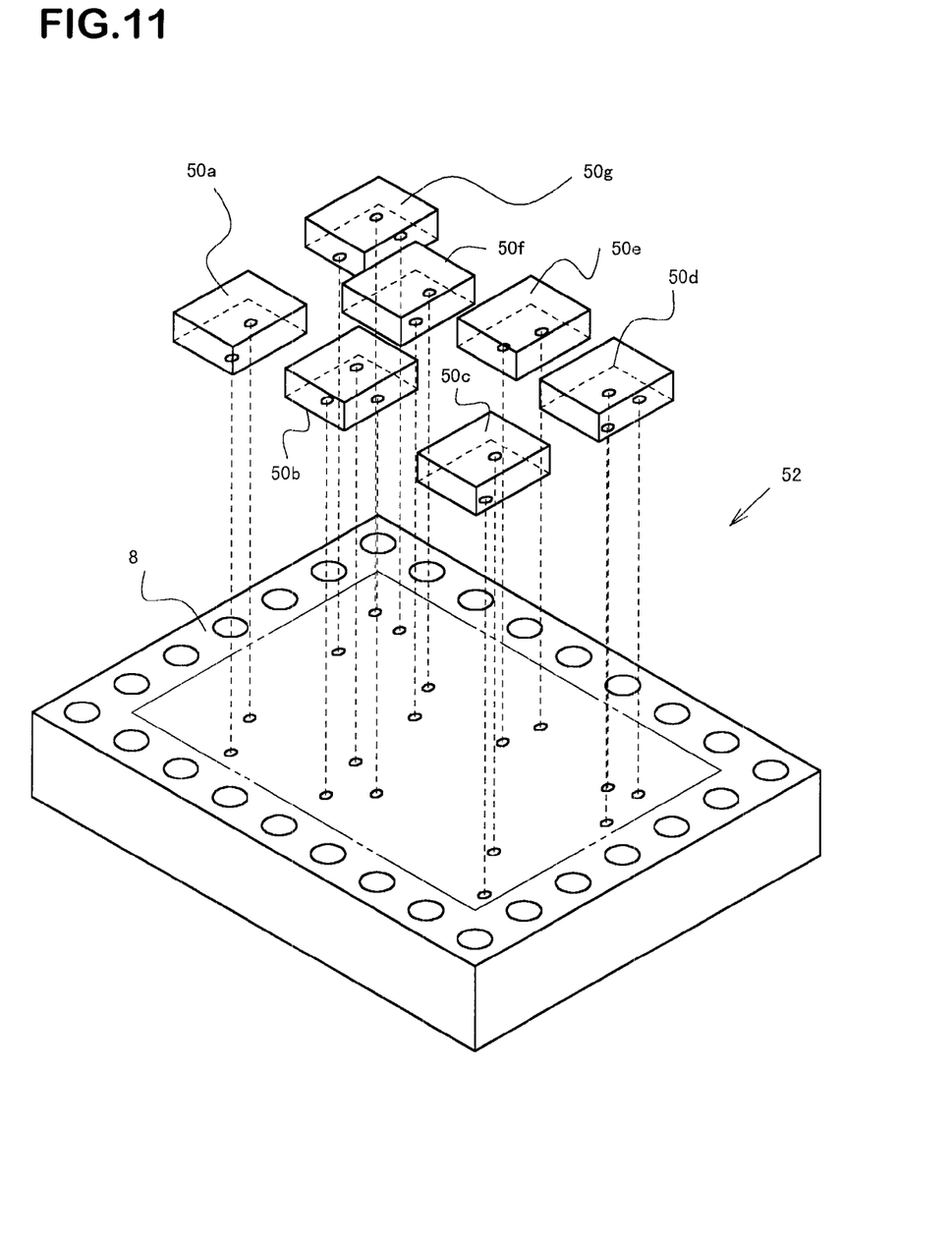
FIG. 11 is an exploded perspective view of a stacked chip as another embodiment of the invention.

FIG. 11 is an exploded perspective view of the configuraton of a stacked chip 52 comprising a plurality of chips (corresponding to the second substrate) 50a, 50b, . . . , 50g arranged in a horizontal array on the first chip 8 (corresponding to the first substrate).

Figure 12:
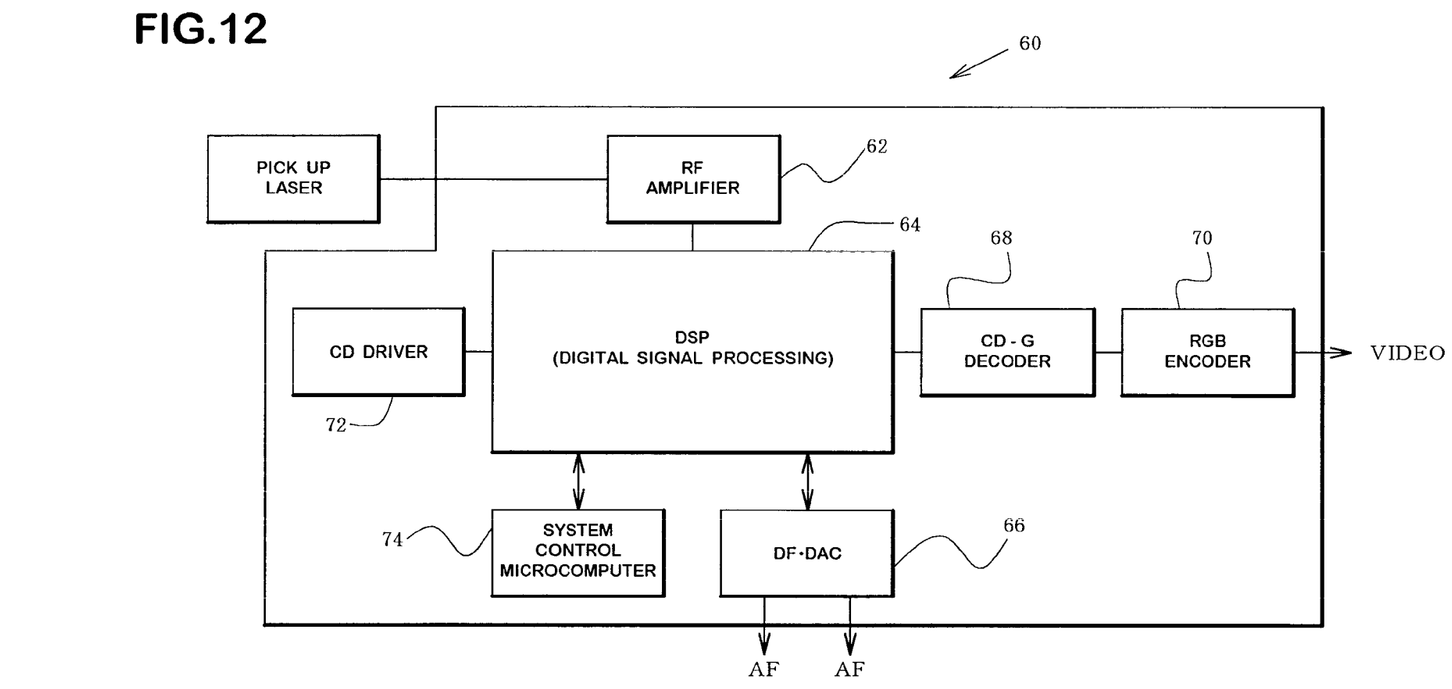
FIG. 12 is a function block diagram showing the constitution of a compact disc system 60.

For example, functional sections constituting a compact disk system 60 shown in FIG. 12, such as an RF amplifier 62, DSP 64, DF-DAC 66, CD-G decoder 68, RGB encoder 70 and CD driver 72, may be formed as the chips 50a, 50b, . . . , 50g shown in FIG. 11, and a system control microcomputer 74 and connecting lines (not shown) between the chips may be formed on the first chip 8.

The compact disk system 60 shown in FIG. 12 has been conventionally constituted with the functional sections such as an RF amplifier 62, DSP 64, DF-DAC 66, CD-G decoder 68, RGB encoder 70, CD driver 72, and the system control microcomputer 74, respectively being formed as separate ICs and mounted on a single board. As a result, compactness has been lacked and manufacturing cost has been high.

With the constitution as shown in FIG. 11, a complicated system such as the compact disk system 60, conventionally made by mounting a plurality of ICs on a single board, may be made with a single stacked chip, namely a single IC. As a result, complicated systems may be made compact and inexpensive.

Figure 10:
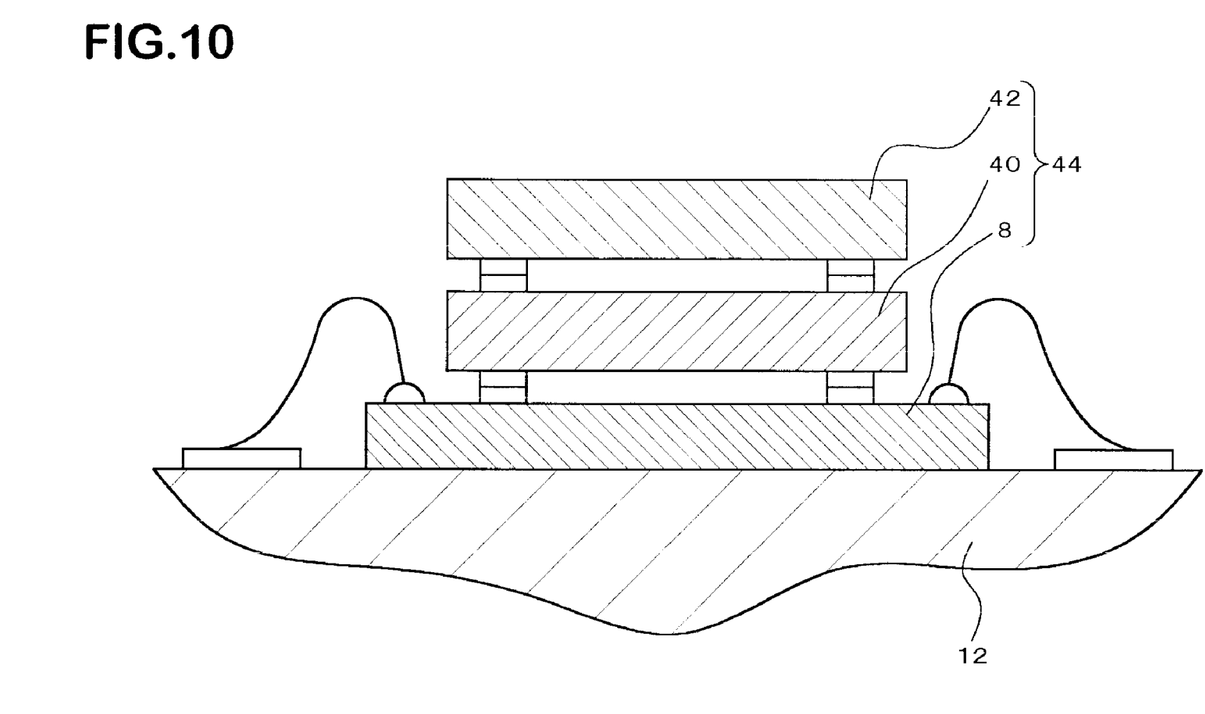
FIG. 10 shows a cross-sectional constitution of a stacked chip as still another embodiment of the invention.

FIG. 10 shows a stacked chip 44 comprising the first chip 8 placing and securing a second chip 40 on the top and third chip 42 placed and secured on the top of the second chip 40. The stacked chip 44 is placed on and secured to the package 12.

In this case the pads to be connected may be disposed on both the of under and over sides the chip (in this embodiment, the second chip 40). Three or more chips may be easily stacked as described above. In that case, the first chip 8 corresponds to the first substrate while the second chip 40 corresponds to the second substrate.

In the case where three or more chips are stacked as shown in FIG. 10 and if the first chip 8 and the third chip 42 are interconnected through wiring (not shown) arranged on the second chip 40, the third chip 42 also corresponds to the second substrate. When the second chip 40 corresponds to the first substrate, the first and second chips 8 and 42 correspond to the second substrate.

In each of the described embodiments, while the FPGA is explained as an example of programmable first functional section, this invention is not limited to such configuration. For example, this invention may be applied to the case that a PLA, which is a kind of PLD, is used as the programmable first functional section.

This invention is characterized by comprising: a first substrate having a programmable first functional section and a first input-output terminal; and a second substrate having a second functional section having a function related to the first functional section , and a second input-output terminal;

the first substrate and the second substrate are stacked together so that the first input-output terminal and the second input-output terminal are electrically interconnected.

Therefore, the function of the first functional section may be flexibly changed corresponding to the second functional section and the external devices. As a result, function of the first functional section may be implemented without creating any new dedicated IC. Additionally, a semiconductor device having a small projected area as well as the functions of both of the first and second functional sections may be also implemented by stacking together the first and second substrates. Furthermore, complicated systems conventionally requiring a large number of ICs may be configured with a single semiconductor device by using the first substrates and the second substrates which are stacked in a large number. As a result, such systems may be realized at a low cost and in a compact size.

Namely, semiconductor devices may be provided that can meet required functions within a short delivery time and at a low price with a high degree of integration.

This invention is characterized in that the second functional section has the function of controlling external devices, and the first functional section has the interface function of interconnecting the second functional section and external devices.

Therefore, when the stacked substrate body is used for example in the control device for controlling external devices, the interface function may be flexibly changed corresponding to the external devices. Further, the use of the stacked substrate results in making the control device of compact size wherein space saving is highly required.

This invention is characterized in that the second functional section has the function of storing information, and the first functional section has the function of processing in association with information stored in the second functional section.

Therefore, when the stacked substrate is used in the DSP (digital signal processor), it is possible to use the second functional section as a RAM (random access memory) and to change the function of the first functional section flexibly corresponding to the contents of the signal processing. The use of the stacked substrate implements a compact DSP.

This invention is characterized in that the second functional section has the function of performing analog processing, and the first functional section has the function of performing digital processing associated with analog processing performed in the second functional section.

Therefore, when the stacked substrate is used for example in a synthesizer using a PLL (phase lock loop) circuit, it is possible to use the second functional section as a VCO (voltage control oscillation circuit) and use the first functional section as a frequency dividing circuit for dividing the output frequency of the VCO. In that case, the frequency dividing circuit may be flexibly changed corresponding to the frequency to be outputted. Additionally a frequency synthesizer of a compact size may be obtained by the use of the stacked substrate.

This invention is characterized in that the second functional section has the function of controlling the first functional section.

Therefore, in the case the second functional section is used as a writing device for programming the first functional section, a PLD that requires no external writing device may be implemented.

This invention is characterized in that power is supplied from the power source to the first substrate, and power is supplied at the same time through the first substrate to the second substrate.

Therefore, it is possible to supply a high voltage as well as a low voltage to the first substrate which requires the high voltage for writing and erasing programs to and from the first functional section, and to supply the low voltage only through the first substrate to the second substrate which does not require the high voltage. Therefore, since the first substrate only needs to be made of a high voltage specification, the second substrate can be made of low voltage specification. Accordingly, the degree of integration of the circuit elements constituting the second substrate may be increased.

This invention is characterized by a constitution comprising: a first substrate having a first functional section having the function of storing information and a first input-output terminal; and a second substrate having a second functional section having the function of controlling the first functional section , and a second input-output terminal; the first substrate and the second substrate being stacked together so that the first input-output terminal and the second input-output terminal are electrically interconnected.

Therefore, in the case the second functional section is used as a device for writing information to the first functional section, an information storing device that requires no external writing device may be implemented. Also, stacking together the first and second substrates makes it possible to realize an information storing device having a small projected area, and having both of the functions of storing information and for example writing information.

This invention is characterized in that the first and second substrates both are provided with high voltage lines, and the voltage of the high voltage line of the first substrate is substantially the same as that of the second substrate.

Therefore, the high voltage line of the first substrate and the high voltage line of the second substrate may be shared by both of the substrates by electrically interconnecting the first and second input-output terminals. As a result, the space required for the high voltage wiring may be saved.

This invention is characterized in that the first input-output terminals and the second input-output terminals are provided in a plurality of pairs for electrically interconnecting the high voltage line of the first substrate and the high voltage line of the second substrate.

Therefore, even in the case a connecting resistance is great when the first input-output terminals and the second input-output terminals are interconnected, the connecting resistance may be reduced by providing a plurality of connecting points.

This invention is characterized in that the first substrate or the second substrate is provided with a terminal for the outside, and one of the first and second input-output terminals belonging to the substrate provided with the terminal for the outside is electrically connected to the terminal for the outside.

Therefore, when the terminal for the outside is provided on the first substrate for example, the terminal for the outside and the second input-output terminal of the second substrate may be electrically interconnected through the first input-output terminal of the first substrate. Therefore, power and signals may be directly transferred between the second substrate having no terminal for the outside and the terminal for the outside.

While the invention is described above in the forms of preferred embodiments, each term is used not for the purpose of limitation but explanation, and therefore, may be changed within the scope of the appended claims without departing from the scope and spirit of the invention.

What is claimed is:

1. A stacked substrate body for controlling an external device, comprising:
a first substrate having a field programmable first functional section for acquiring required functions that can be changed flexibly corresponding to a plurality of second functional sections and the external device by connecting to and disconnecting from each other a plurality of pre-arranged circuit elements through programmable switching means, and a plurality of first input-output terminals corresponding to the first functional section;
a plurality of second substrates having the second functional sections respectively which have functions for controlling the external device related to the first functional section, and a second input-output terminal corresponding to the second functional section and being located on the first substrate;

connecting lines among the second substrates being formed on the first substrate as the programmable first functional section and being flexibly connected and disconnected electrically corresponding to the second functional sections by controlling the first functional section; and the first and second substrates being stacked together so that the first and second input-output terminals are electrically interconnected.

2. The stacked substrate body of claim 1, characterized in that the second functional section is used as a writing device for programming the first functional section.

3. The stacked substrate body of claim 1, characterized in that power from a power source is supplied to the first substrate, and further to the second substrate through the first substrate.

4. The stacked substrate body of claim 3, characterized in that a high voltage power as well as a low voltage power are supplied to the first substrate, and a low voltage power only is supplied to the second substrate through the first substrate.

5. The stacked substrate body of claim 1, characterized in that the first and second substrates both are provided with high voltage lines, and the voltage of the high voltage line of the first substrate is made substantially the same as that of the high voltage line of the second substrate.

6. The stacked substrate body of claim 5, characterized in that plural pairs of first and second input-output terminals are provided to electrically interconnect the high voltage line of the first substrate and the high voltage line of the second substrate.

7. The stacked substrate body of claim 1, characterized in that one of the first and second substrate is provided with a terminal for performing input or output to the outside of the stacked substrate body, and one of the first and second input-output terminals belonging to the substrate having the terminal for the outside and the terminal for the outside are electrically interconnected.

8. A semiconductor device for controlling an external device, comprising:

a first substrate having a field programmable first functional section for acquiring required functions that can be changed flexibly corresponding to a plurality of second functional sections and the external device by connecting to and disconnecting from each other a plurality of pre-arranged circuit elements through programmable switching means, and a plurality of first input-output terminals corresponding to the first functional section;

a plurality of second substrates having the second functional sections respectively which have functions for controlling the external device related to the first functional section, and a second input-output terminal corresponding to the second functional section, and being located on the first substrate;

connecting lines among the second substrates being formed on the first substrate as the programmable first functional section and being flexibly connected and disconnected electrically corresponding to the second functional sections by controlling the first functional section; and the first and second substrates being stacked together so that the first and second input-output terminals are electrically interconnected.

9. A stacked substrate body for controlling an external device, comprising:

a first substrate having a field programmable first functional section for acquiring required functions that can be changed flexibly corresponding to a plurality of second functional sections and the external device by connecting to and disconnecting from each other a plurality of prearranged circuit elements through programmable switching means, and a plurality of first input-output terminals corresponding to the first functional section, the first input-output terminals being flexibly connected and disconnected electrically corresponding to the external device by controlling the first functional section;

a second substrate having the second functional sections respectively which have functions for controlling the external device related to the first functional section, and a second input-output terminal corresponding to the second functional section and being located on the first substrate;

the first and second substrate being stacked together so that the first and second input-output terminals are electrically interconnected.

10. A semiconductor device for controlling an external device, comprising:

a first substrate having a field programmable first functional section for acquiring required functions that can be changed flexibly corresponding to a plurality of second functional sections and the external device by connecting to and disconnecting from each other a plurality of pre-arranged circuit elements through programmable switching means, and a plurality of first input-output terminals corresponding to the first functional section, the first input-output terminals being flexibly connected and disconnected electrically corresponding to the external device by controlling the first functional section;

a second substrate having the second functional sections respectively which have functions for controlling the external device related to the first functional section, and a second input-output terminal corresponding to the second functional section and being located on the first substrate;

the first and second substrate being stacked together so that the first and second input-output terminals are electrically interconnected.

* * * * *